US008211325B2

United States Patent
Diao et al.

(10) Patent No.: US 8,211,325 B2
(45) Date of Patent: Jul. 3, 2012

(54) PROCESS SEQUENCE TO ACHIEVE GLOBAL PLANARITY USING A COMBINATION OF FIXED ABRASIVE AND HIGH SELECTIVITY SLURRY FOR PRE-METAL DIELECTRIC CMP APPLICATIONS

(75) Inventors: Jie Diao, Fremont, CA (US); Garlen C. Leung, San Jose, CA (US); Christopher Heung-Gyun Lee, San Jose, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 307 days.

(21) Appl. No.: 12/757,767

(22) Filed: Apr. 9, 2010

(65) Prior Publication Data

US 2010/0285666 A1    Nov. 11, 2010

Related U.S. Application Data

(60) Provisional application No. 61/176,364, filed on May 7, 2009.

(51) Int. Cl.
*B44C 1/22* (2006.01)
*C03C 15/00* (2006.01)
*C03C 25/68* (2006.01)
*C23F 1/00* (2006.01)

(52) U.S. Cl. ............... 216/88; 216/89; 438/692; 451/41
(58) Field of Classification Search .................... 216/88, 216/89; 438/692; 451/41
See application file for complete search history.

(56) References Cited

U.S. PATENT DOCUMENTS

| 5,244,534 | A * | 9/1993 | Yu et al. ................... 438/672 |
| 5,970,376 | A | 10/1999 | Chen et al. |
| 6,027,996 | A | 2/2000 | Wu et al. |
| 6,848,976 | B2 * | 2/2005 | Somekh ..................... 451/41 |
| 7,063,597 | B2 | 6/2006 | Prabhu et al. |
| 7,413,991 | B2 | 8/2008 | Tseng |
| 2003/0176151 | A1 | 9/2003 | Tam et al. |
| 2006/0006074 | A1 | 1/2006 | Liu et al. |
| 2007/0232014 | A1 | 10/2007 | Larsen et al. |
| 2008/0029478 | A1 * | 2/2008 | Hsu et al. ................. 216/38 |

* cited by examiner

*Primary Examiner* — Roberts Culbert
(74) *Attorney, Agent, or Firm* — Patterson & Sheridan, LLP

(57) ABSTRACT

A method and apparatus for polishing or planarizing a pre-metal dielectric layer by a chemical mechanical polishing process are provided. The method comprises providing a semiconductor substrate having feature definitions formed thereon, forming a pre-metal dielectric layer over the substrate, wherein the as-deposited pre-metal dielectric layer has an uneven surface topography, and planarizing the uneven surface topography of the pre-metal dielectric layer using chemical mechanical polishing techniques, wherein planarizing the uneven surface topography comprises polishing the pre-metal dielectric layer with a fixed abrasive polishing pad and a first polishing composition to remove a bulk portion of the pre-metal dielectric layer and achieve a first predetermined planarity, and polishing the pre-metal dielectric layer with a non-abrasive polishing pad and high selectivity slurry to remove a residual portion of the pre-metal dielectric and achieve a second predetermined planarity.

20 Claims, 13 Drawing Sheets

PROCESS SEQUENCE TO ACHIEVE GLOBAL PLANARITY USING A COMBINATION OF FIXED ABRASIVE AND HIGH SELECTIVITY SLURRY FOR PRE-METAL DIELECTRIC CMP APPLICATIONS

CROSS-REFERENCE TO RELATED APPLICATIONS

This application claims benefit of U.S. Provisional Patent Application Ser. No. 61/176,364, filed May 7, 2009, which is herein incorporated by reference.

BACKGROUND OF THE INVENTION

1. Field of the Invention

Embodiments described herein relate to removing material from a substrate. More particularly, the embodiments described herein relate to polishing or planarizing a pre-metal dielectric layer using a chemical mechanical polishing process.

2. Description of the Related Art

Sub-quarter micron multi-level metallization is one of the key technologies for the next generation of ultra large-scale integration (ULSI). The multilevel interconnects that lie at the heart of this technology require planarization of interconnect features formed in high aspect ratio apertures, including contacts, vias, trenches and other features. Reliable formation of these interconnect features is very important to the success of ULSI and to the continued effort to increase circuit density and quality on individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process in which material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor manufacturing processes.

Chemical Mechanical Planarization, or Chemical Mechanical Polishing (CMP), is a common technique used to planarize substrates. CMP utilizes chemical compositions, such as slurries or other fluid medium, for selective removal of materials from substrates. In conventional CMP techniques, a substrate carrier or polishing head is mounted on a carrier assembly and positioned in contact with a polishing pad in a CMP apparatus. The carrier assembly provides a controllable pressure to the substrate, thereby pressing the substrate against the polishing pad. The pad is moved relative to the substrate by an external driving force. The CMP apparatus affects polishing or rubbing movements between the surface of the substrate and the polishing pad while dispersing a polishing composition to affect chemical activities and/or mechanical activities and consequential removal of materials from the surface of the substrate.

Shallow trench isolation (STI) provides an efficient means of producing integrated circuits. In the STI process, CMP is used to planarize an oxide to expose a nitride stop.

One objective of CMP is to achieve global planarization by reducing global step height between areas of different density and/or size within each substrate as well as achieving uniform surface topography from substrate to substrate when performing a batch polishing process.

Therefore, there is a need for a polishing process which accurately and reliably removes a predictable amount of material while achieving global planarization within each substrate as well as achieving uniform surface topography from substrate to substrate.

SUMMARY OF THE INVENTION

Embodiments described herein relate to removing material from a substrate. More particularly, the embodiments described herein relate to polishing or planarizing a pre-metal dielectric layer by a chemical mechanical polishing process. In one embodiment a method of planarizing a pre-metal dielectric layer is provided. The method comprises planarizing an uneven surface topography of a pre-metal dielectric layer using chemical mechanical polishing techniques, comprising polishing the pre-metal dielectric layer with a fixed abrasive polishing pad and a first polishing composition to remove a bulk portion of the pre-metal dielectric layer to achieve a first predetermined planarity, and polishing the pre-metal dielectric layer with a saturated non-abrasive polishing pad and a high selectivity slurry to remove a residual portion of the pre-metal dielectric to achieve a second predetermined planarity. In one embodiment, the first polishing composition is a non-abrasive polishing composition. In another embodiment, the first polishing composition is an abrasive containing polishing composition. In one embodiment, the non-abrasive polishing pad is saturated with the high selectivity slurry prior to removing the residual portion of the pre-metal dielectric.

In another embodiment, a method of planarizing a substrate is provided. The method comprises positioning a substrate having patterned feature definitions comprising high density active areas, medium density active areas, and low density active areas formed in a silicon material layer having a pre-metal dielectric layer disposed thereon, wherein the pre-metal dielectric layer is deposited on the substrate in an amount sufficient to fill the feature definitions, polishing the pre-metal dielectric layer with a fixed-abrasive polishing pad and a non-abrasive polishing composition to remove a bulk portion of the pre-metal dielectric layer, wherein the pre-metal dielectric layer overlying the high density active areas and the low density active areas of the feature definitions is planarized at a faster rate than the pre-metal dielectric layer overlying the medium density active areas, and polishing the pre-metal dielectric layer with a non-abrasive polishing pad and a high selectivity slurry (HSS) to remove a residual portion of the pre-metal dielectric layer, wherein the pre-metal dielectric layer overlying the medium density active areas is planarized at a faster rate than the pre-metal dielectric layer overlying the high density active areas and the pre-metal dielectric layer overlying the low density active areas to form a planarized surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiment without specific recitation.

DETAILED DESCRIPTION

Figure 1A:
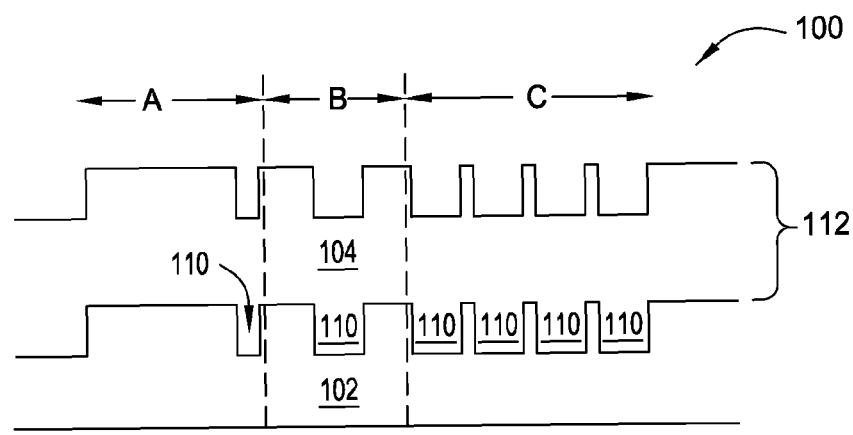
FIGS. 1A-1C are schematic diagrams illustrating the phenomena of global step height.

Embodiments described herein relate to removing material from a substrate. More particularly, the embodiments described herein relate to polishing or planarizing a pre-metal dielectric layer using a chemical mechanical polishing process.

The words and phrases used herein should be given their ordinary and customary meaning in the art by one skilled in the art unless further defined. Chemical mechanical polishing (CMP) should be broadly construed, but is not limited to, planarizing a substrate surface using chemical activity and mechanical activity, or a concurrent application of chemical activity and mechanical activity. High selectivity slurries are used in shallow trench isolation (STI) CMP.

Selectivity is broadly defined herein as the preferential removal of one material in comparison to another material and is typically denoted as a removal rate ratio between a first material and second, or subsequent, materials. In one embodiment, the HSS exhibits self stopping characteristics where the polishing stops automatically at a certain planarization level due to some of the additives in the polishing composition which inhibit polishing at a certain planarization level. In another embodiment, the HSS exhibits stop on nitride characteristics where the polishing stops automatically in areas where nitride material is exposed.

The selectivity of a STI slurry is defined as the ratio of the material removal rate of oxide to that of silicon nitride. In one embodiment, the ratio of oxide removal to nitride removal for a STI slurry may be between about 10:1 and 30:1. In one embodiment, the ratio of oxide removal to nitride removal is about 15:1. One type of high-selectivity slurry system used for STI CMP process has been two-component ceria-based slurry, which requires mixing prior to employing it. The mixing ratio governs the slurry performance including material removal rate and selectivity. When the mixing ratio falls into certain ranges, HSS slurry will exhibit very low oxide removal on blanket wafers, while the removal rate is much higher on patterned wafers with pronounced topography. Topography on pattern wafers will be gradually reduced during polishing and as a result there will be a gradual drop in oxide removal rate. Oxide removal rate will eventually become very low after most topography is removed. The process is referred to as "self-stopping" and slurry showing such characteristics is referred to as "stop-on-planar" slurry. The HSS slurry must be "stop-on-planar" for the process described in this patent application to work.

Pattern density should be broadly construed and includes, but is not limited to the percentage of active area relative to total area; the concept of pattern density is typically applied locally and is best defined in an area where a certain pattern repeats. For example, for a line-and-space structure, the line is the active area and space is the trench area. If line width is 10 μm and space is 90 μm, the pattern density is calculated as 10%. If a single block of trench or active area is significantly larger than any other ambient features, the local pattern density is regarded as 0% (for the trench) or 100% (for the active area), although the single block is not repeating.

Topography is broadly defined herein as any projections or recessions formed at the exposed surface of the pre-metal dielectric material, which provides a non-planar surface. For example, chemical vapor deposition (CVD) of silicon oxide may produce an exposed surface containing peaks of material extending above the bulk silicon oxide material.

Bulk dielectric material is broadly described herein as dielectric material deposited on the substrate in an amount more than sufficient to substantially fill features formed on the substrate surface. The bulk dielectric material may also be referred to as overfill material or blanket material.

Residual dielectric material is broadly defined as any bulk dielectric material remaining after one or more polishing process steps as well as the residue of any additional materials from layers disposed below the bulk dielectric material. Residual dielectric material may partially or completely cover the surface of a substrate. For example, residual material may cover about 25% or less of the surface area of the substrate. In another example, residual material may comprise about 25% or less of the originally deposited dielectric material, such as about 1,000 Å remaining after a polishing step on 4,000 Å of dielectric material.

Figure 1B:
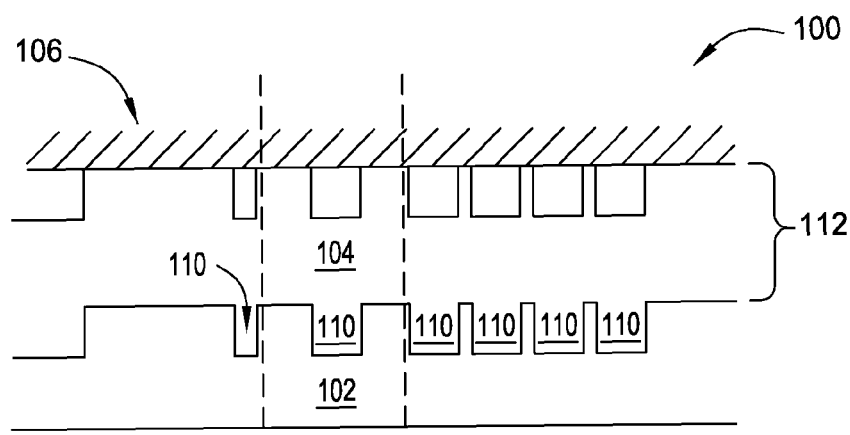
Figure 1C:
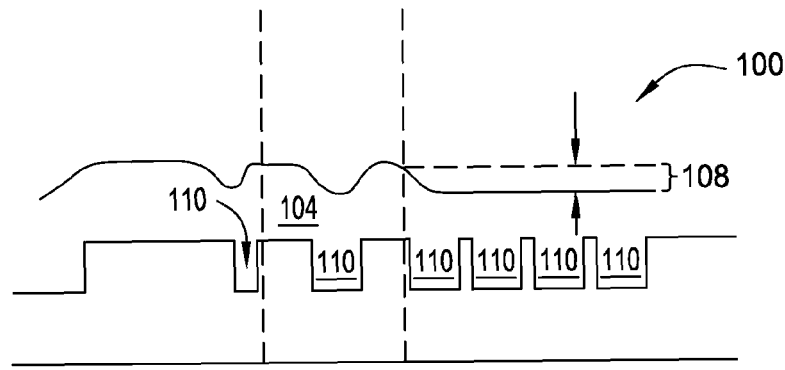

FIGS. 1A-1C are schematic diagrams illustrating the phenomena of global step height. FIG. 1A shows a substrate 100 having patterned feature definitions 110 formed in a material layer 102, such as, for example, a polysilicon material or doped polysilicon material, having a pre-metal dielectric material 104 such as, for example, a silicon oxide material disposed thereon. The pre-metal dielectric material 104 fills the feature definitions 110 of the patterned substrate 100. The feature definitions 110 of the substrate 100 comprise high density active areas (A), medium density active areas (B), and low density active areas (C). As shown in FIG. 1A, the excess pre-metal dielectric material 112 has a topography that mimics the topography of the patterned featured definitions 110 of the substrate 100. It is desirable for the surface of the pre-metal dielectric material 104 to be uniform. FIG. 1B shows a polishing pad 106 contacting the surface of pre-metal dielectric material 104 to commence a chemical mechanical polishing process.

FIG. 1C illustrates the phenomena of global step height observed while polishing with conventional techniques to remove the excess pre-metal dielectric material 112. During polishing of the pre-metal dielectric material, some topography is observed over active areas of medium and high density while the active areas of low density or "isolated active sites" are polished at a greater rate almost down to the adjacent trench level. The global step height is represented by the difference 108 between the pre-metal dielectric thickness on the active areas of medium or high density and the pre-metal dielectric thickness over the active areas of low density. It is desirable to achieve a global step height of zero after polishing. However, conventional polishing techniques generally result in a global step height much greater than zero.

In one embodiment described herein, the structures on a semiconductor substrate are divided into three different categories: line-and-space structures of low density or medium density and open block structures of high density. An open block structure is defined as an area which consists of a continuous block of the same structure (e.g., active oxide) in two dimensions (width and length). Open block structures may also be referred to as high density active areas. In one embodiment, the open block structure is defined as 100% Active 4,000 µm. The width and length of the block should be at least comparable in magnitude to the largest dimension of any other structure on the substrate. There can be other different structures in the block as long as they are isolated, sparsely populated and occupy only a relatively small area. Structures other than the open blocks on the substrate are defined as line-and-space structures of either low density or medium density. In one embodiment, a low density line and space structure is defined as 10% Active 100 µm and below. In one embodiment, a medium density line and space structure is defined as everything in between 10% Active 100 µm and 100% Active 4,000 µm. It has been a challenge for traditional CMP to achieve a tight range of planarization efficiency between these different structures.

Figure 2:
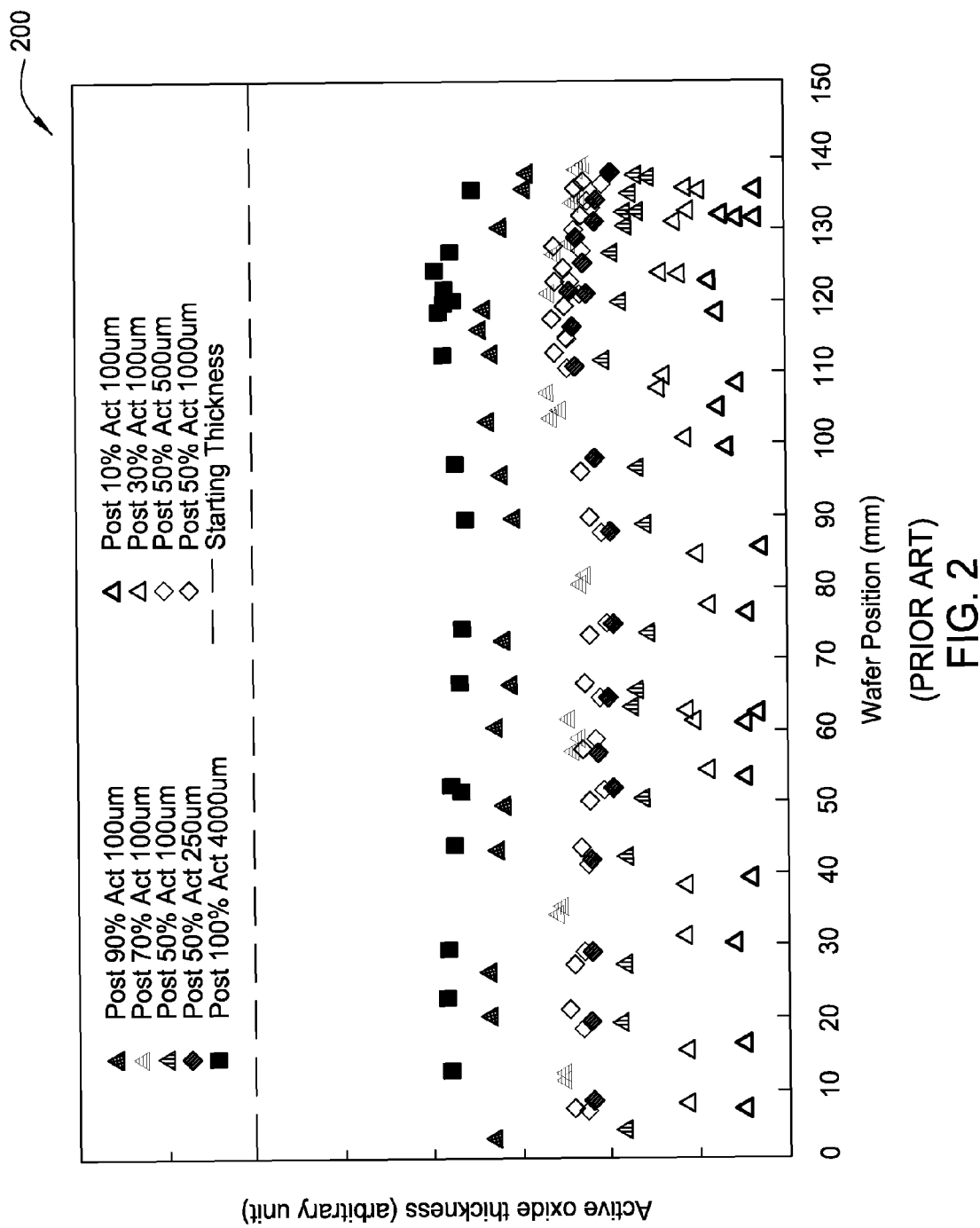
FIG. 2 is a schematic plot demonstrating a range of oxide thickness over the active areas on a substrate for a prior art polishing process.

FIG. 2 is a plot 200 demonstrating a range of oxide thickness over the active areas on a substrate for a prior art polishing process. The y-axis of FIG. 2 represents the active oxide thickness (arbitrary units) of an oxide layer after a traditional CMP polishing process and the x-axis represents the substrate position (mm) with 0 mm representing the center of the substrate and 150 mm representing the edge of the substrate. Active oxide thickness is defined as the oxide thickness over active areas. As shown in FIG. 2 the difference in planarity between open block structures and line-and-space structures is quite large. It should be noted that although arbitrary units are used, FIGS. 2-5 are all based on the same scale.

Figure 3:
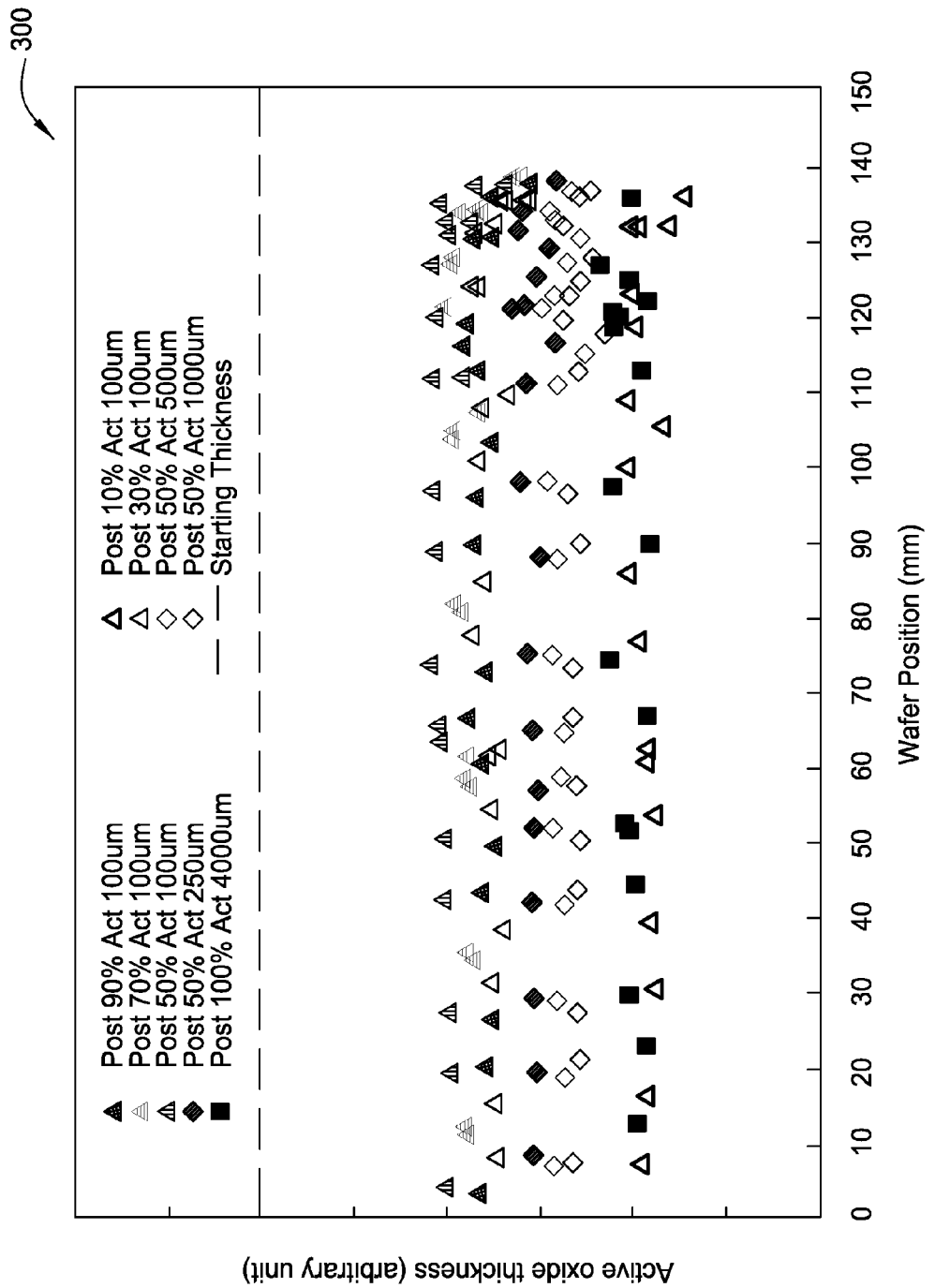
FIG. 3 is a schematic plot demonstrating a range of oxide thickness over the active areas on a substrate for a fixed abrasive polishing process.
Figure 4:
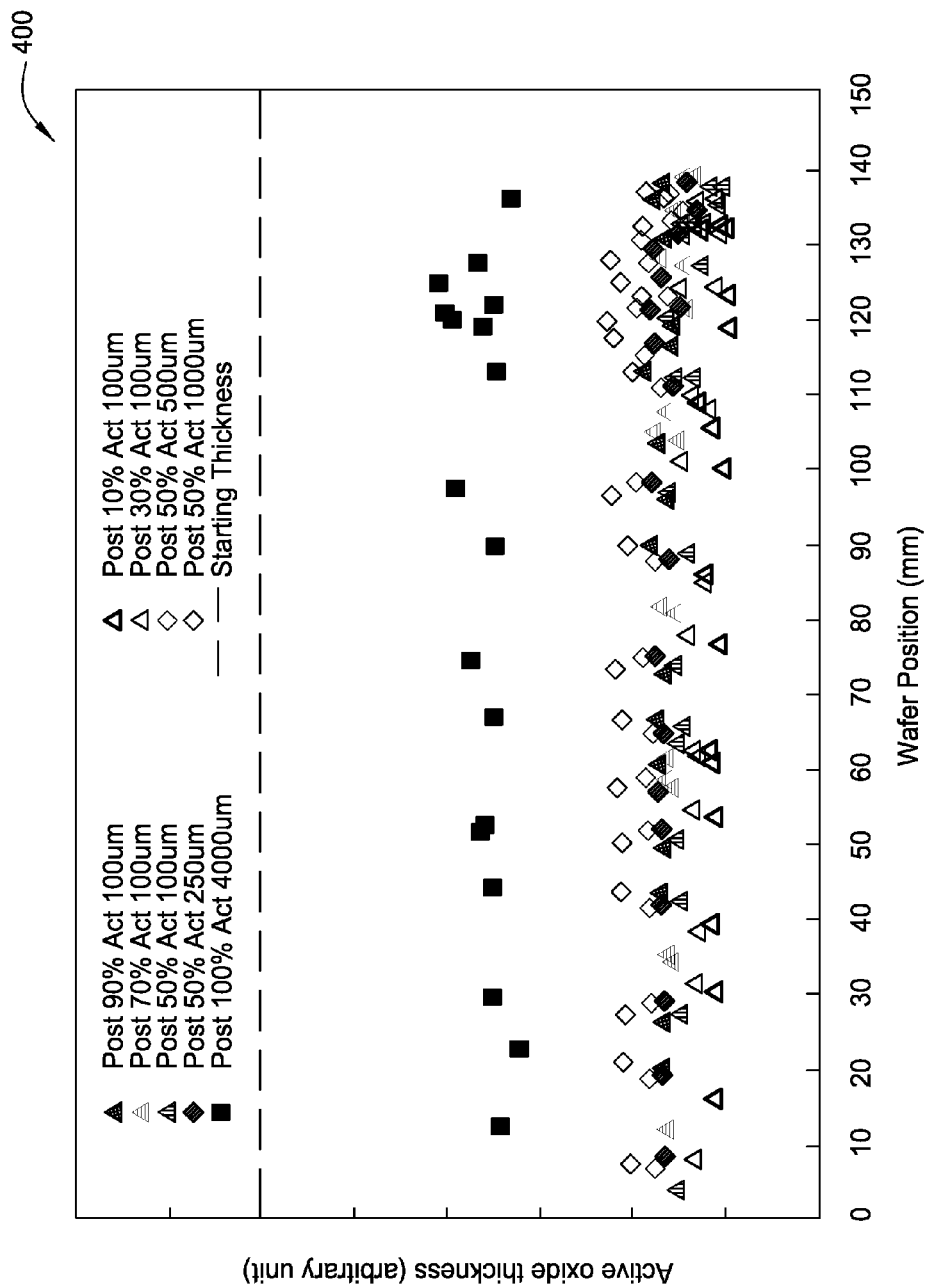
FIG. 4 is a schematic plot demonstrating a range of oxide thickness over the active areas on a substrate for a high selectivity slurry polishing process.

FIG. 3 is a schematic plot 300 demonstrating a range of oxide thickness over the active areas on a substrate for a fixed abrasive polishing process. FIG. 4 is a schematic plot 400 demonstrating a range of oxide thickness over the active areas on a substrate for a polishing process using a high selectivity slurry. The y-axis of FIGS. 3 and 4 represents the active oxide thickness (arbitrary units) of an oxide layer after a polishing process and the x-axis represents the substrate position (mm) with 0 mm representing the center of the substrate and 150 mm representing the edge of the substrate. Experimental results demonstrate that fixed abrasive (FA) techniques (e.g polishing with fixed abrasive pads) can be very effective in controlling planarity on active areas of low density and high density, including open block structures, as shown in FIG. 3. But FA techniques poorly control the planarity of medium density line-and-space structures during the initial stages of the polishing process. Polishing with high selectivity slurry (HSS) can effectively minimize the difference in planarity among both medium and low density line-and-space structures. However, as shown in FIG. 4, HSS processes fail to polish open blocks effectively.

Figure 5:
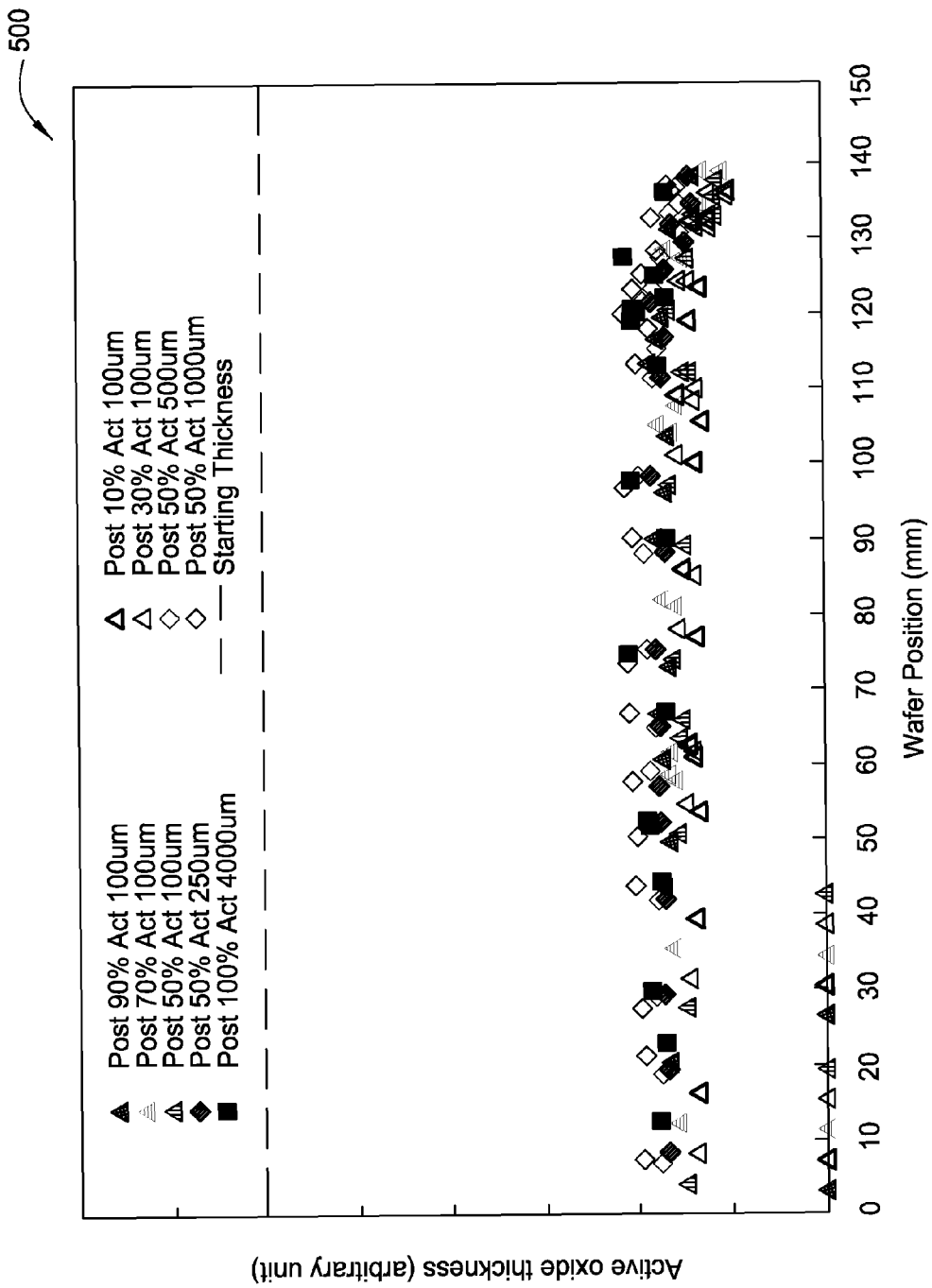
FIG. 5 is a schematic plot demonstrating a range of oxide thickness over the active areas on a substrate for a polishing process according to embodiments described herein.

FIG. 5 is a schematic plot 500 demonstrating a range of oxide thickness over the active areas on a substrate for a polishing process according to embodiments described herein. FIG. 5 shows that the range of active oxide thickness among various structures is much tighter than the prior art process of FIG. 1.

Embodiments described herein relate to a two-step chemical mechanical polishing sequence that achieves a tight range of planarization efficiency among different structures. In one embodiment, the range of the planarity level that can be obtained with the HSS on the line-and-space structures is determined in advance by polishing a set-up substrate or series of set-up substrate with a HSS.

In one embodiment, in a first step, FA techniques are used to polish open block structures and low density line-and-space structures down to a desired planarity level at a greater rate than medium density line-and-space structures, and second, a HSS is used to polish the medium density line-and-space structures at a greater rate than the open block structures and the low density line-and-space structures. Because the second polishing step has little impact on open block structures, by carefully choosing the desired planarity level in the first polishing step and tuning the second polishing step, the planarity level of open blocks and line-and-space structures will converge to a tight range as shown in FIG. 5.

While the particular apparatus in which the embodiments described herein can be practiced is not limited, it is particularly beneficial to practice the embodiments in a REFLEXION® CMP system, REFLEXION® LK CMP system, and a MIRRA MESA® system sold by Applied Materials, Inc., Santa Clara, Calif. Additionally, CMP systems available from other manufacturers may also benefit from embodiments described herein. Embodiments described herein may also be practiced on overhead circular track polishing systems.

Figure 6:
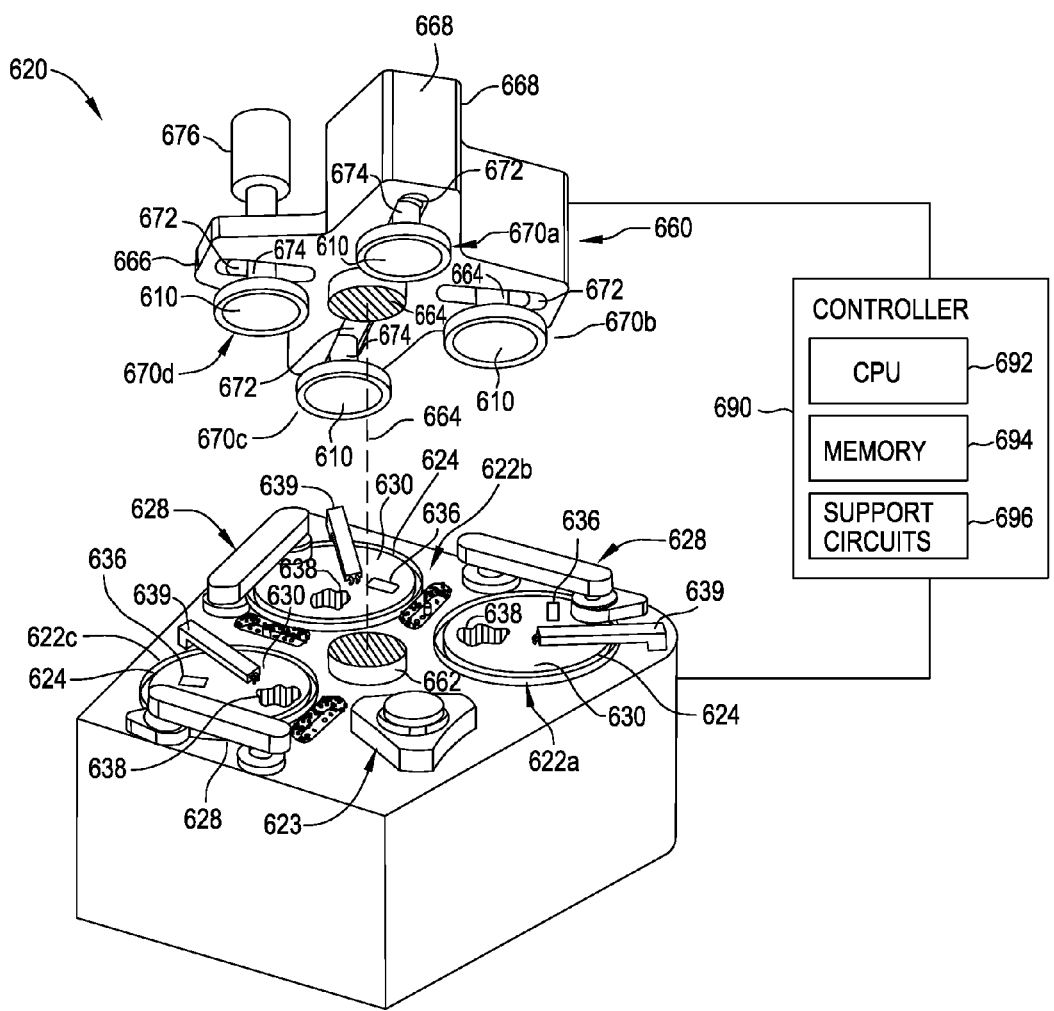
FIG. 6 is a schematic cross-sectional view of a chemical mechanical polishing apparatus for use with embodiments described herein.

FIG. 6 shows a chemical mechanical polishing apparatus 620 that can polish one or more substrates 610 such as semiconductor wafers. The polishing apparatus 620 includes a series of polishing stations 622a-c and a transfer station 623. The transfer station 623 transfers the substrates 610 between the carrier heads 670a-d and a loading apparatus (not shown).

Each polishing station 622a-c includes a rotatable platen assembly 624 on which is placed a polishing pad assembly 630. The first and second stations 622a, 622b can each include either a two-layer polishing pad with a hard durable outer surface or a fixed-abrasive pad with embedded abrasive particles. The final polishing station 622c can include a relatively soft pad. Each polishing station 622a-c can also include a pad conditioner apparatus 628 to maintain the condition of the polishing pad assembly 630 so that it will effectively polish substrates. In certain embodiments, the polishing pad assembly may be conditioned using an ex-situ pad conditioning process.

A rotatable multi-head carousel 660 supports four carrier heads 670. The carousel 660 is rotated by a central post 662 about a carousel axis 664 by a carousel motor assembly (not shown) to orbit the carrier heads 670 and the substrates 610 attached thereto between the polishing stations 622a-c and the transfer station 623. Three of the carrier heads 670 receive and hold substrates 610, and polish the substrates 610 by pressing them against the polishing pad assembly 630. Meanwhile, one of the carrier heads 670 receives a substrate 610 from and delivers a substrate 610 to the transfer station 623.

Each carrier head 670 is connected by a carrier drive shaft 674 to a carrier head rotation motor 676 (shown by the removal of one quarter of cover 668) so that each carrier head 670 can independently rotate about it own axis. In addition, each carrier head 670 independently laterally oscillates in a radial slot 672 formed in carousel support plate 666. A description of a suitable carrier head 670 can be found in U.S. Pat. No. 6,422,927, entitled CARRIER HEAD WITH CONTROLLABLE PRESSURE AND LOADING AREA FOR CHEMICAL MECHANICAL POLISHING.

A polishing composition 638 comprising compositions selected from the group comprising an oxidizer, a passivation agent such as a corrosion inhibitor, a pH buffer, a metal complexing agent, and combinations thereof can be supplied to the surface of the polishing pad assembly 630 by a polishing fluid dispense arm assembly 639. In one embodiment, the polishing composition is a non-abrasive polishing composition. In another embodiment, the polishing composition 638 is an abrasive containing polishing composition including abrasive particles (e.g., silicon dioxide for oxide polishing, ceria, etc.). A clear window 636 is included in the polishing pad assembly 630 and is positioned such that it passes beneath substrate 610 during a portion of the platen's rotation, regardless of the translational position of the carrier head 670. The clear window 636 may be used for metrology devices, for example, an eddy current sensor may be placed below the clear window 636. In certain embodiments, the window 636 and related sensing methods may be used for an endpoint detection process.

To facilitate control of the polishing apparatus 620 and processes performed thereon, a controller 690 comprising a central processing unit (CPU) 692, a memory 694, and support circuits 696, is connected to the polishing apparatus 620. The CPU 692 may be one of any form of computer processor that can be used in an industrial setting for controlling various drives and pressures. The memory 694 is connected to the CPU 692. The memory 694, or computer-readable medium, may be one or more of readily available memory such as random access memory (RAM), read only memory (ROM), floppy disk, hard disk, or any other form of digital storage, local or remote. The support circuits 696 are connected to the CPU 692 for supporting the processor in a conventional manner. These circuits include cache, power supplies, clock circuits, input/output circuitry, subsystems, and the like.

Chemical Mechanical Polishing Process:

Embodiments described herein provide chemical mechanical polishing methods to planarize a substrate surface with reduced or minimal global step height after the polishing process. Methods are provided for polishing pre-metal dielectric layers, such as silicon oxides with two processing steps, with at least one processing step using a fixed abrasive polishing pad. The processing steps may be used to remove all, substantially all, or a portion of a pre-metal dielectric layer.

FIGS. 7A-7D are schematic diagrams illustrating a polishing method according to embodiments described herein. A substrate 700 having patterned feature definitions 710 formed in a material layer 702, such as a polysilicon material or doped polysilicon layer, having a pre-metal bulk dielectric fill material 704 such as a silicon oxide layer disposed thereon is provided. The pre-metal bulk dielectric fill material 704 fills the feature definitions 710 of the substrate. The pre-metal bulk dielectric fill material 704 is deposited on the substrate surface in a sufficient amount to fill the feature definitions 710. The pre-metal bulk dielectric fill material 704 may be deposited using chemical vapor deposition (CVD) techniques. The feature definitions 710 comprise high density active areas (A), medium density active areas (B), and low density active areas (C) that mimic the topography of the patterned feature definitions 710 of the substrate 700.

Figure 7A:
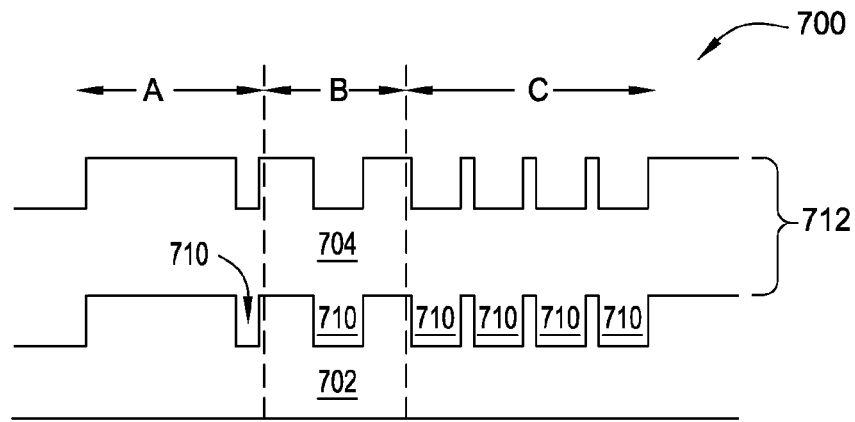
FIGS. 7A-7D are schematic diagrams illustrating a polishing method according to embodiments described herein.
Figure 7B:
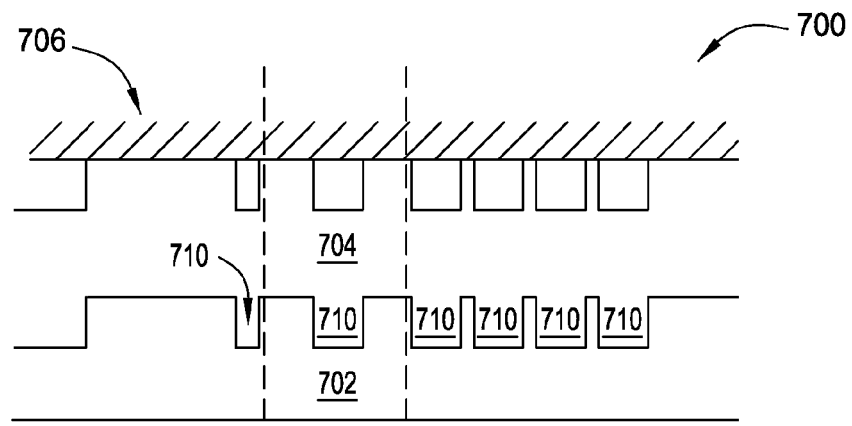
Figure 7C:
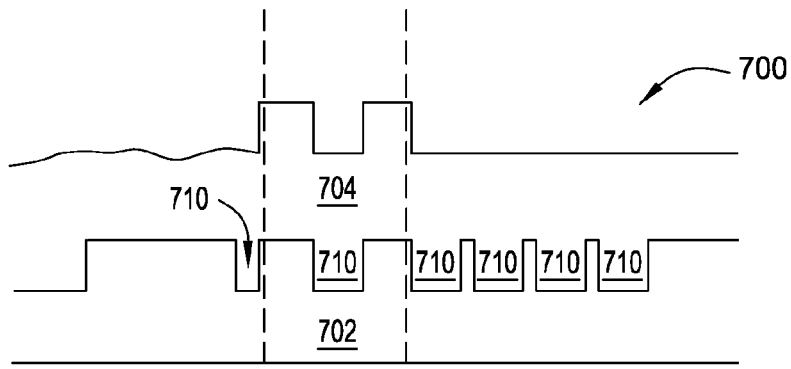
Figure 7D:
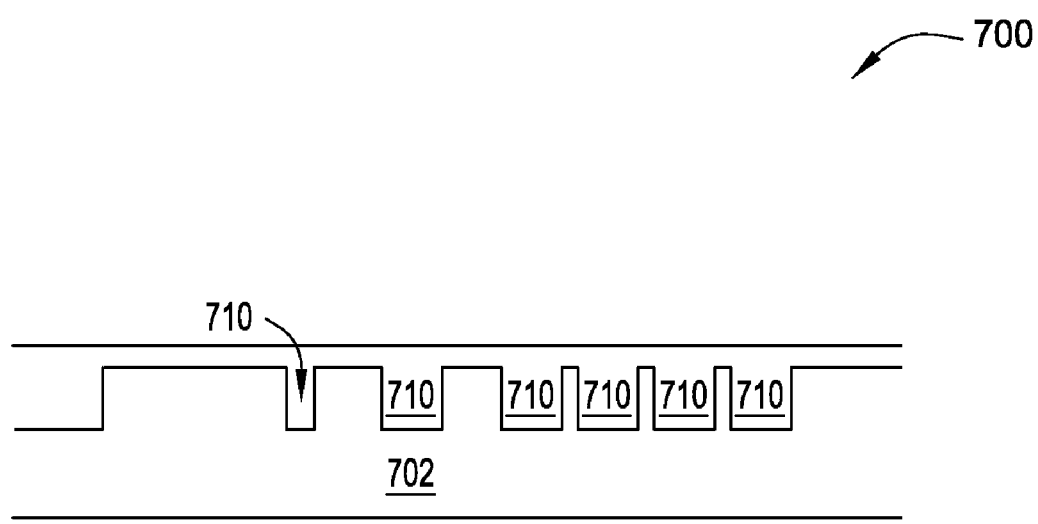

The pre-metal bulk dielectric fill material 704 generally has an excess material deposition 712 of bulk pre-metal dielectric material, that has an uneven surface topography with peaks and recesses typically formed over feature definitions 710 having varying widths as shown in FIG. 7A. The pre-metal bulk dielectric fill material 704 is polished in a first polishing step with a fixed-abrasive polishing pad 706 and a first polishing composition to remove a portion of the pre-metal bulk dielectric fill material 704 overlying the feature definitions 710 as shown in FIG. 7B. The first polishing composition may comprise either an abrasive containing polishing composition or a non-abrasive polishing composition. The pre-metal bulk dielectric fill material 704 overlying the high density active areas (A) and the low density active areas (C) of the feature definitions 710 is planarized at a faster rate than the pre-metal bulk dielectric fill material 704 overlying the medium density active areas (B) as shown in FIG. 7C. The remaining pre-metal bulk dielectric fill material 704 may then be planarized using a high selectivity slurry (HSS) to polish the medium density active areas at a faster rate leading to a convergence of the planarity of the medium density active areas with the low density active areas and the high density active areas to form a planarized surface as shown in FIG. 7D.

Figure 8:
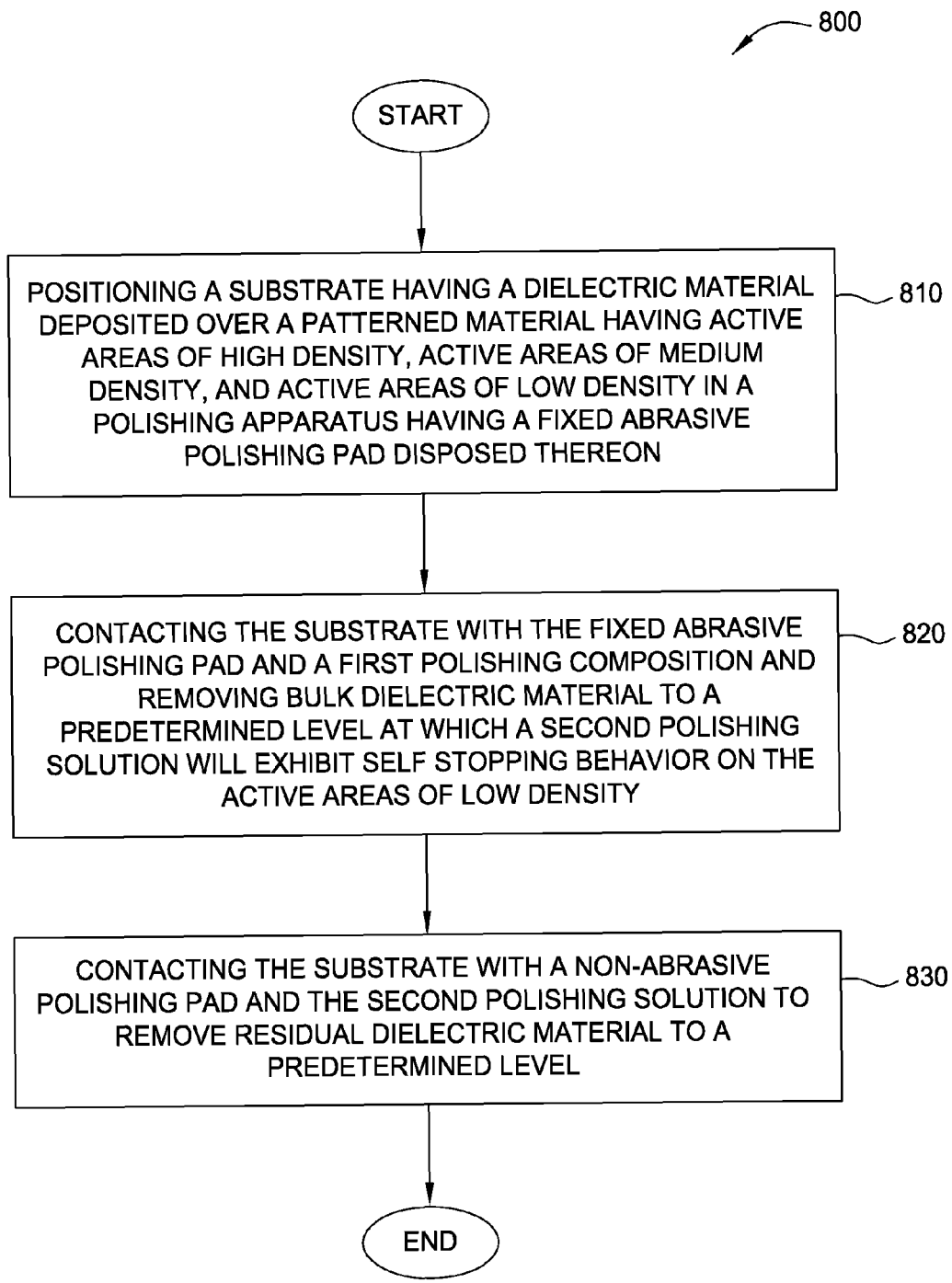
FIG. 8 is a flow chart of one embodiment of a polishing method according to embodiments described herein.

FIG. 8 is a flow chart of one embodiment of a polishing method 800 for polishing a substrate as illustrated in FIGS. 7A-7D. In block 810, a substrate similar to substrate 700 is positioned in a polishing apparatus having a fixed abrasive polishing pad disposed thereon. As detailed above, the substrate may have a dielectric material deposited over a patterned material having active areas of high density, active areas of medium density, and active areas of low density. The polishing apparatus may be similar to the polishing apparatus 620 described above.

In block 820, the substrate is contacted with the fixed abrasive polishing pad and a first polishing composition to remove the dielectric material to a first predetermined level at which a second polishing composition will exhibit self-stopping behavior or stop on planar capability on the low density active sites.

For example, the substrate may be polished with an abrasive-free or non-abrasive polishing composition on a fixed abrasive polishing pad with the polishing to remove about 80% of the pre-metal dielectric fill material, and ending when there is approximately 20% of residual dielectric material remaining.

The fixed-abrasive polishing article may be a high removal rate fixed-abrasive web material, for example, the SWR-550 fixed-abrasive polishing article, commercially available from 3M of Minneapolis, Minn. The non-abrasive polishing composition may exhibit stop on nitride characteristics where the polishing stops automatically when nitride material is exposed. In one embodiment, ceria and/or silica may be added to the polishing composition to form an abrasive containing polishing composition. One example of a polishing composition for use with fixed-abrasive polishing pads is a proline or I-proline containing polishing composition which is more fully described in co-pending U.S. patent application Ser. No. 10/074,345, filed on Feb. 12, 2002, published as US 2003-0176151, and entitled "STI Polish Enhancement Using Fixed Abrasives With Amino Acid Additives". Another example of a polishing composition for use with fixed abrasive polishing pads is polishing composition containing at least one organic compound selected from a group comprising glycine, proline, arginine, histidine, lysine, and picolinic acid and a surfactant such as a fluorosurfactant which is more fully described in U.S. patent application Ser. No. 11/839, 048, filed on Aug. 15, 2007, published as US 2008-0182413, and entitled "Selective Chemistry For Fixed Abrasive CMP".

In block 830, the substrate is contacted with a non-abrasive polishing pad and a high selectivity slurry (HSS) that exhibits self-stopping behavior on the low density active sites to remove residual dielectric material. In one embodiment, the HSS is an abrasive-containing polishing composition, for example, a silica or ceria containing slurry, on an abrasive-free polishing pad to remove most or all of the residual dielectric material to a second predetermined planarity level. An example of an abrasive-free polishing article is the IC-1000 polishing article commercially available from Rodel Inc., of Phoenix Ariz.

In certain embodiments it may be advantageous to polish a set-up substrate or series of set-up substrates with similar profiles using similar polishing parameters to determine the first predetermined planarity level when to transition from the fixed-abrasive polishing pad of block 820 to the non-abrasive polishing pad of block 830. In one embodiment, a series of set-up substrates are polished to different planarization levels and monitored using optical metrology tools to monitor the evolution of the polishing profile of each substrate to determine the optimal polishing conditions for the fixed-abrasive polish of block 820.

In certain embodiments, it may be advantageous to saturate the polishing pad with a polishing composition exhibiting self-stopping behavior prior to polishing the substrate with the non-abrasive polishing pad. As discussed above, when using HSS, the slurries will show self-stopping behavior where oxide removal dies out after a certain point after some initial polishing. It is believed that the self-stopping behavior is caused by the accumulation of additives, abrasive particles and/or polishing by-products on the platen. Since the polishing composition distribution relative to the substrate is typically not uniform, the material accumulation will not proceed at the same rate on different parts of the platen. As a result, some areas may stop polishing earlier than other areas. This generally leads to within wafer non-uniformity (WIWNU) of oxide removal.

In one embodiment, pad saturation of the polishing pad can be achieved by first polishing a dummy substrate for a time period long enough, for example, sixty seconds, to saturate the polishing pad and not rinsing the polishing pad before polishing additional substrates. The polishing pad will remain in a saturated state as long as no pad rinse is implemented before polishing the substrate, after polishing the substrate, during de-chucking of the substrate, or during cross-rotation. Since the polishing pad remains in a fully saturated state, variations in material removal caused by different areas reaching saturation at different times is eliminated leading to improved within-wafer-non-uniformity (WIWNU) of oxide removal.

Figure 9:
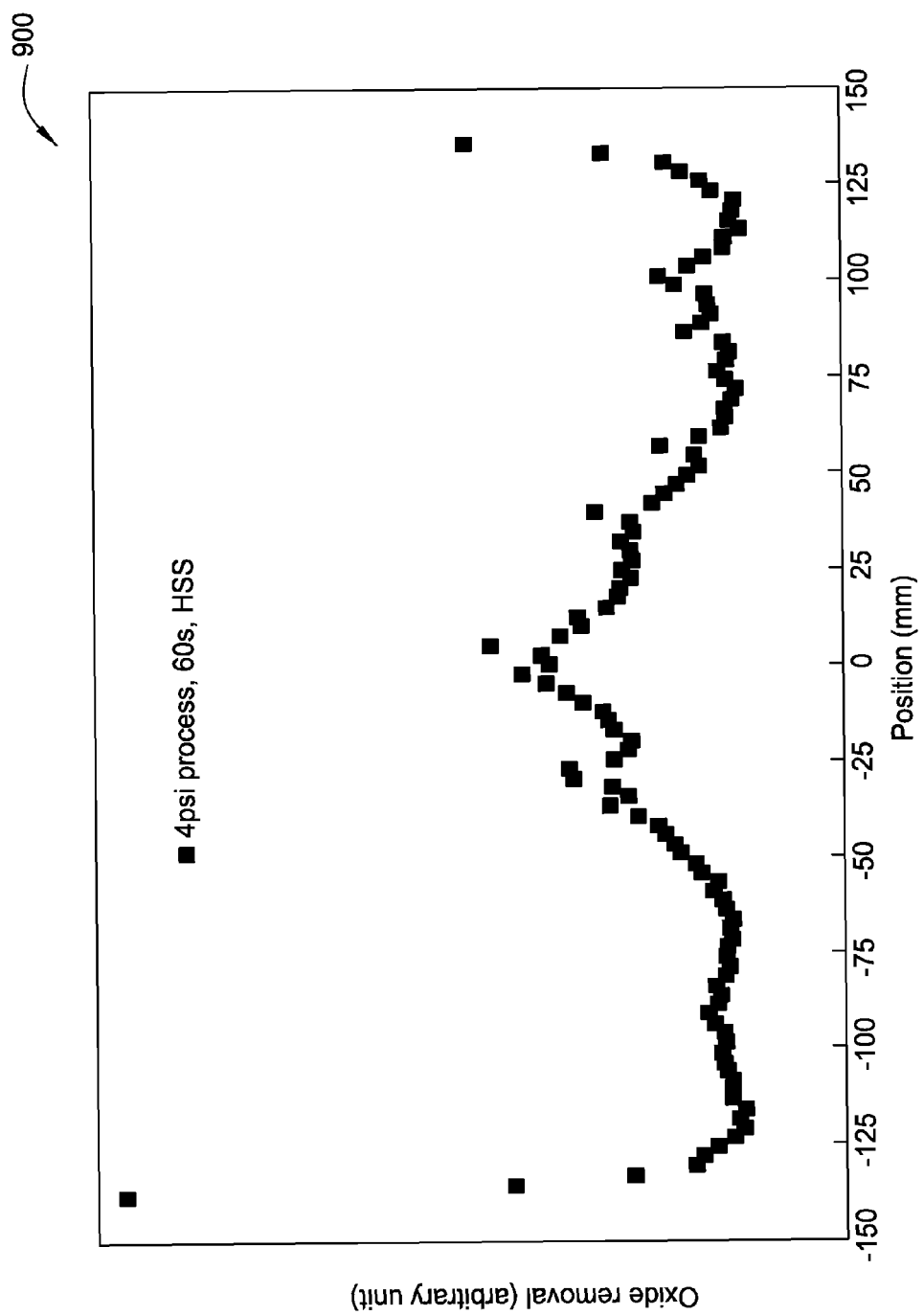
FIG. 9 is a schematic plot demonstrating a range of oxide removal over a blanket substrate for a prior art polishing process.

FIG. 9 is a schematic plot 900 demonstrating a range of oxide removal on a blanket substrate for a prior art polishing process performed without a pad saturation step. The y-axis represents oxide removal (arbitrary units) and the x-axis represents position (mm) on a 300 mm substrate. As shown in FIG. 9, oxide removal varies across the surface of the substrate indicating that different areas of the polishing pad are exhibiting self stopping characteristics at different times.

Figure 10:
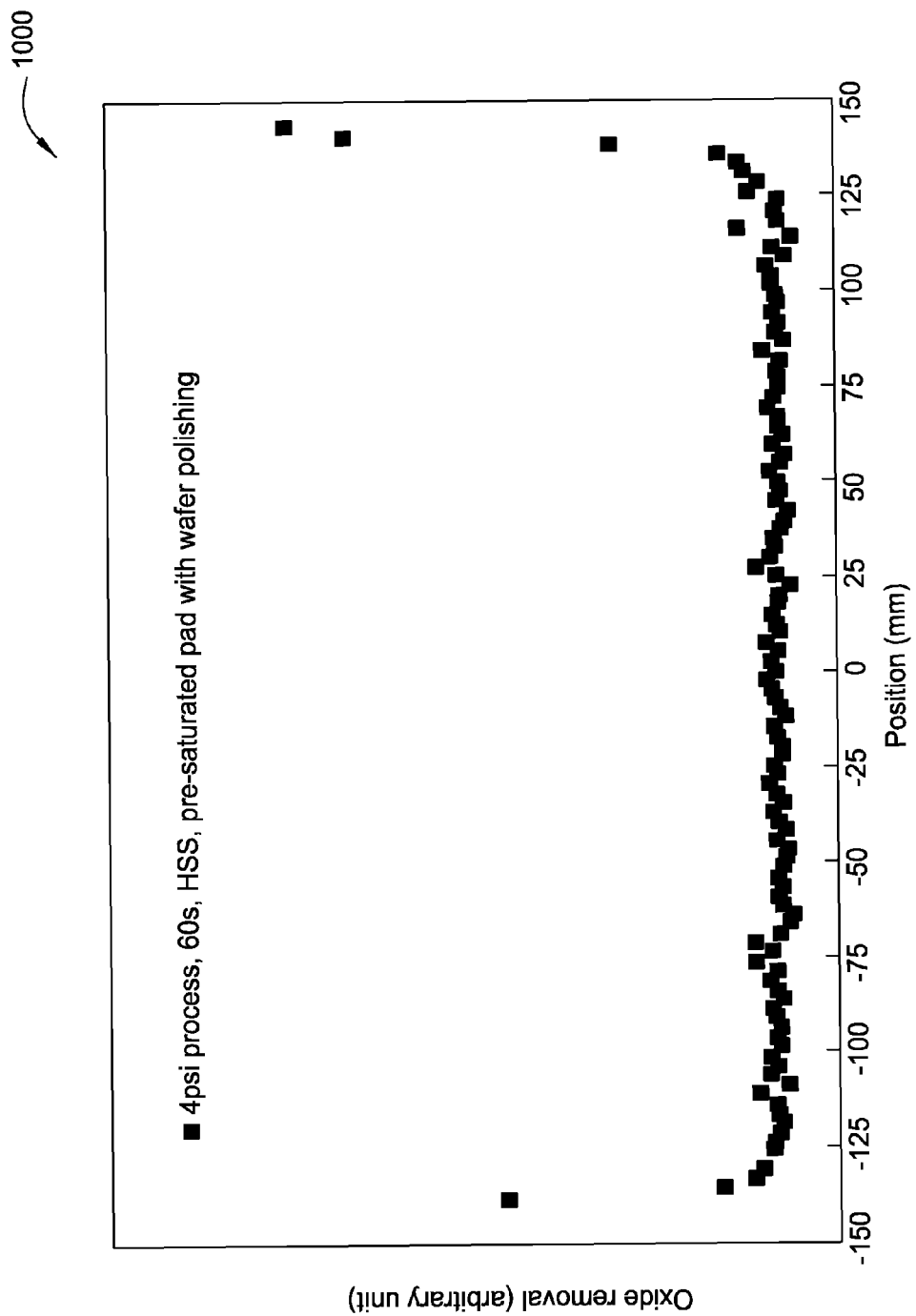
FIG. 10 is a schematic plot demonstrating a range of oxide removal over a blanket substrate for a polishing process according to embodiments described herein.

FIG. 10 is a schematic plot 1000 demonstrating a range of oxide removal on a blanket substrate for a polishing process with a pad saturation step according to embodiments described herein. The y-axis represents oxide removal (arbitrary units) and the x-axis represents position (mm) on a 300 mm substrate. As shown in FIG. 10, oxide removal across the substrate is much more uniform after a pad saturation process is performed.

In certain embodiments, it may be advantageous to saturate the non-abrasive polishing pad with a polishing slurry exhibiting self-stopping behavior using an ex-situ pad conditioning process prior to polishing the substrate with the non-abrasive polishing pad.

Ex-situ pad conditioning with a HSS slurry flowing during a conditioning process achieves results similar to pad saturation with the dummy wafer. The level of pad saturation is dependent on pad conditioning parameters. Pad conditioning parameters include but are not limited to the time of the ex-situ conditioning step, the down force of the conditioning head, the slurry flow rate during ex-situ conditioning, the rotation speed of the platen, and the rotation speed of the conditioning disk. Thus the self stopping behavior of the polishing pad may be tuned by modifying the pad conditioning parameters during the pad saturation process.

Figure 11:
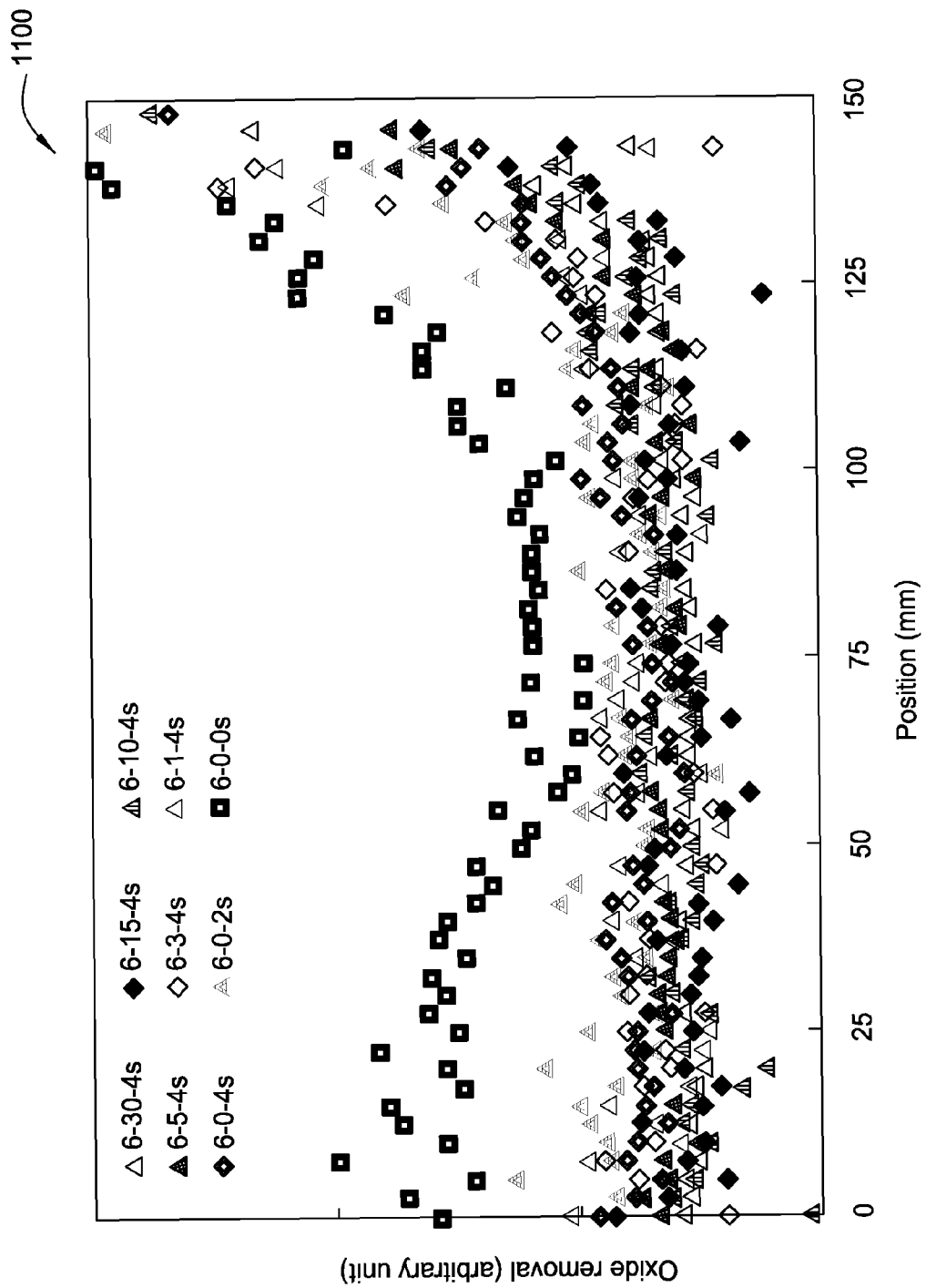
FIG. 11 is a schematic plot demonstrating a range of oxide removal over a blanket substrate for a polishing process according to embodiments described herein.
Figure 12:
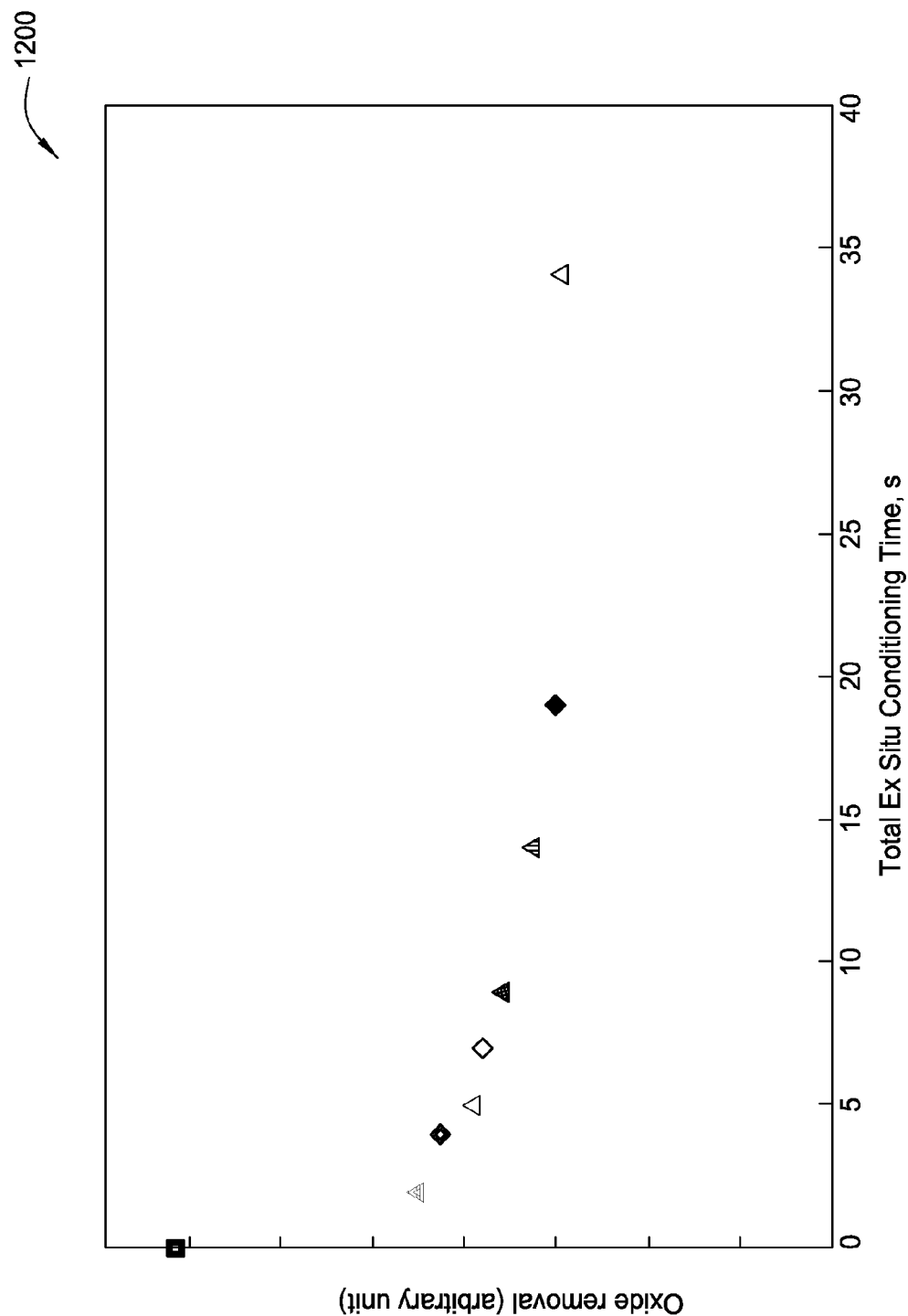
FIG. 12 is a schematic plot demonstrating the average removal of oxide versus total ex-situ conditioning time for a polishing process according to embodiments described herein.

Known ex-situ conditioning processes are usually performed with high pressure de-ionized (DI) water rinse rather than with slurry flowing. FIG. 11 is a schematic plot 1100 showing different removal profiles with different amount of ex-situ conditioning (ex-situ condition time is the sum of the three numbers for each label, in seconds). The y-axis represents oxide removed (Å) and the x-axis represents position (mm) on a 300 mm substrate. FIG. 12 is a schematic plot 1200 demonstrating the average removal of oxide (Å) versus total ex-situ conditioning time (seconds) for a polishing process according to embodiments described herein.

FIG. 12 reprocesses the data in FIG. 11 and plots the average removal versus total ex-situ conditioning time. It can be seen that average removal levels off after ~20 s, signifying that the pad has reached saturation. Therefore, for the specific process that was used to generate FIGS. 11 and 12, the required ex-situ conditioning time to achieve pad saturation is ~30 s. Pad saturation performed with ex-situ conditioning advantageously integrates pad saturation into a CMP process so that it can be easily implemented in production.

EXAMPLES

The following hypothetical non-limiting examples are provided to further illustrate embodiments described herein. However, the examples are not intended to be all inclusive and are not intended to limit the scope of the embodiments described herein.

Example 1

A new patterned wafer was polished step-wise using a HSS having stop on planar characteristics with each polishing cycle lasting for a time period, for example, about 30 seconds. After each polishing cycle, oxide removal on the smallest and least dense feature of interest was measured; when the oxide removal rate on the smallest and least dense feature of interest dropped below a predetermined level, for example, 100 Å/min, the oxide thickness was recorded as $t_{final}$. Several new patterned wafers were polished using fixed abrasive polishing pads for different periods of time, for example, 60 seconds, 120 seconds, 180 seconds, etc., and through trial-and-error, the amount of fixed-abrasive polishing time that was needed to bring oxide thickness on the smallest and least dense feature of interest down to $t_{final}$ plus $t_{margin}$, a predetermined margin, for example, 400 Å, was determined. Planarity corresponding to $t_{final}+t_{margin}$ is referred to as the first predetermined planarity. After polishing a wafer down to the first predetermined planarity using fixed-abrasives, the wafer was polished step-wise using the HSS with a non-abrasive pad with each polishing cycle lasting for a time period, for example, about 30 seconds. After each polishing cycle, the oxide removal on all features of interest was measured. The oxide thickness when oxide removal rate on all features of interest dropped below a predetermined level, for example, 100 Å/min, was recorded. The planarity corresponding to this thickness is referred to as the second predetermined planarity.

While the foregoing is directed to embodiments of the present invention, other and further embodiments of the invention may be devised without departing from the basic scope thereof, and the scope thereof is determined by the claims that follow.

The invention claimed is:

1. A method of planarizing a pre-metal dielectric layer, comprising:
 planarizing an uneven surface topography of a pre-metal dielectric layer using chemical mechanical polishing techniques, comprising:
  polishing the pre-metal dielectric layer with a fixed abrasive polishing pad and a first polishing composition to remove a bulk portion of the pre-metal dielectric layer to achieve a first predetermined planarity; and
  polishing the pre-metal dielectric layer with a saturated non-abrasive polishing pad and a high selectivity slurry to remove a residual portion of the pre-metal dielectric to achieve a second predetermined planarity.

2. The method of claim 1, wherein the non-abrasive polishing pad is saturated with the high selectivity slurry prior to polishing the pre-metal dielectric with the non-abrasive polishing pad so that the high selectivity slurry will exhibit self-stopping behavior.

3. The method of claim 2, wherein the non-abrasive polishing pad is saturated with the high selectivity slurry by polishing a dummy substrate while flowing the high selectivity slurry onto the non-abrasive polishing pad to saturate the polishing pad and not rinsing the polishing pad prior to polishing the pre-metal dielectric layer with the saturated non-abrasive polishing pad.

4. The method of claim 2, wherein the non-abrasive polishing pad is saturated with the high selectivity slurry by saturating the non-abrasive polishing pad with the high selectivity slurry during an ex-situ pad conditioning process prior to polishing the substrate with the non-abrasive polishing pad.

5. The method of claim 1, wherein the first polishing composition comprises a non-abrasive polishing composition.

6. The method of claim 1, wherein the high selectivity slurry exhibits self stopping behavior.

7. The method of claim 1, further comprising:
 polishing a series of set-up substrates with polishing profiles similar to the substrate with a high selectivity slurry to determine the first predetermined planarity and the second predetermined planarity.

8. The method of claim 1, wherein the fixed-abrasive polishing pad comprises a high removal rate fixed-abrasive web material.

9. The method of claim 1, wherein the substrate comprises a polysilicon material and the pre-metal dielectric layer comprises silicon oxide.

10. The method of claim 1, wherein the feature definitions comprise high density active areas, medium density active areas, and low density active areas.

11. A method of planarizing a substrate, comprising:
 positioning a substrate having patterned feature definitions comprising high density active areas, medium density active areas, and low density active areas formed in a silicon material layer having a pre-metal dielectric layer disposed thereon, wherein the pre-metal dielectric layer is deposited on the substrate in an amount sufficient to fill the feature definitions;
 polishing the pre-metal dielectric layer with a fixed-abrasive polishing pad and a non-abrasive polishing composition to remove a bulk portion of the pre-metal dielectric layer, wherein the pre-metal dielectric layer overlying the high density active areas and the low density active areas of the feature definitions is planarized at a faster rate than the pre-metal dielectric layer overlying the medium density active areas; and
 polishing the pre-metal dielectric layer with a non-abrasive polishing pad and a high selectivity slurry (HSS) to remove a residual portion of the pre-metal dielectric layer, wherein the pre-metal dielectric layer overlying the medium density active areas is planarized at a faster rate than the pre-metal dielectric layer overlying the high density active areas and the pre-metal dielectric layer overlying the low density active areas to form a planarized surface.

12. The method of claim 11, wherein the second polishing composition exhibits self stopping capability.

13. The method of claim 11, further comprising:
 polishing a series of set-up substrates with polishing profiles similar to the substrate with a high selectivity slurry to determine an endpoint for the polishing the pre-metal dielectric layer with a fixed-abrasive polishing pad and a non-abrasive polishing composition.

14. The method of claim 11, wherein the fixed-abrasive polishing pad comprises a high removal rate fixed-abrasive web material.

15. The method of claim 11, wherein the pre-metal dielectric layer comprises silicon oxide.

16. The method of claim 11, wherein the high density active area is defined as an area which consists of a continuous block of the same structure in two dimensions where the width and length of the block is comparable in magnitude to the largest dimension of any other structure on the substrate.

17. The method of claim 16, wherein the low density active area is defined as an active area which is isolated, sparsely populated, and occupies only a relatively small area and a medium density active area is defined as all active areas not including high density active areas and low density active areas.

18. The method of claim 11, further comprising saturating the non-abrasive polishing pad with the high selectivity slurry prior to polishing the pre-metal dielectric layer with a non-abrasive polishing pad and a high selectivity slurry (HSS) so that the high selectivity slurry will exhibit self-stopping behavior.

19. The method of claim 18, wherein saturating the non-abrasive polishing pad with the high selectivity slurry comprises polishing a dummy substrate while flowing the high selectivity slurry onto the polishing pad to saturate the polishing pad and not rinsing the polishing pad prior to polishing the pre-metal dielectric layer with a non-abrasive polishing pad and a high selectivity slurry (HSS).

20. The method of claim 18, wherein saturating the non-abrasive polishing pad with the high selectivity slurry comprises saturating the non-abrasive polishing pad with the high selectivity slurry during an ex-situ pad conditioning process prior to polishing the pre-metal dielectric layer with a non-abrasive polishing pad and a high selectivity slurry (HSS).

* * * * *